US012707936B2

(12) United States Patent
Ikeda et al.

(10) Patent No.: US 12,707,936 B2
(45) Date of Patent: Aug. 11, 2026

(54) SUBSTRATE PROCESSING METHOD AND SUBSTRATE PROCESSING APPARATUS

(71) Applicant: Tokyo Electron Limited, Tokyo (JP)

(72) Inventors: Yoshinori Ikeda, Koshi City (JP); Toru Hirata, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 208 days.

(21) Appl. No.: 18/436,248

(22) Filed: Feb. 8, 2024

(65) Prior Publication Data

US 2024/0178046 A1 May 30, 2024

Related U.S. Application Data

(62) Division of application No. 17/443,286, filed on Jul. 23, 2021, now Pat. No. 11,955,365.

(30) Foreign Application Priority Data

Aug. 3, 2020 (JP) ................................ 2020-131883

(51) Int. Cl.

*H10P 72/76* (2026.01)
*H10P 50/64* (2026.01)
*H10P 72/00* (2026.01)

(52) U.S. Cl.

CPC ........ *H10P 72/7606* (2026.01); *H10P 50/642* (2026.01); *H10P 72/0424* (2026.01); *H10P 72/7608* (2026.01)

(58) Field of Classification Search

CPC ......... H01L 21/68721; H01L 21/30604; H01L 21/6708; H01L 21/68728; H01L 21/67051; H01L 21/6875; H01L 21/68764; H01L 21/67034

USPC ....................................... 156/345.5; 438/748

See application file for complete search history.

(56) References Cited

U.S. PATENT DOCUMENTS

| | | | |
|---|---|---|---|
| 9,460,740 B1 * | 10/2016 | Staffaroni ............ | G02B 6/0013 |
| 2005/0076531 A1 | 4/2005 | Smith et al. | |
| 2011/0226626 A1 | 9/2011 | Choi et al. | |
| 2012/0205850 A1 | 8/2012 | Zama et al. | |

(Continued)

FOREIGN PATENT DOCUMENTS

| | | |
|---|---|---|
| JP | 2002-093891 A | 3/2002 |
| JP | 2007-103730 A | 4/2007 |

(Continued)

*Primary Examiner* — Duy Vu N Deo

(74) *Attorney, Agent, or Firm* — Armstrong Teasdale LLP

(57) ABSTRACT

A substrate processing apparatus includes a holder for holding a substrate horizontally, a rotator for rotating the holder, a liquid supplier for supplying liquid to the substrate, and a controller for controlling the holder, the rotator, and the liquid supplier. The holder includes a turntable configured to be rotated by the rotator, at least one first clamper configured to be rotated together with the turntable and moved between a clamping position and a releasing position, and at least one second clamper configured to be rotated with the turntable and moved between the clamping and releasing positions independently of the at least one first clamper. The controller controls the at least one first clamper and the at least one second clamper to alternately clamp the peripheral edge of the substrate while the holder is being rotated by the rotator and the liquid is being supplied to the substrate.

2 Claims, 13 Drawing Sheets

(56) References Cited

U.S. PATENT DOCUMENTS

2014/0373289 A1 12/2014 Miyazaki et al.
2017/0323659 A1* 11/2017 Matsumoto ........... G11B 5/3116
2018/0047612 A1 2/2018 Breingan et al.
2018/0277417 A1 9/2018 Ishii et al.
2019/0311938 A1 10/2019 Chen et al.
2019/0318954 A1 10/2019 Kobayashi et al.
2020/0020563 A1* 1/2020 Nishida ............. H01L 21/67028
2020/0203189 A1 6/2020 Hachiya et al.
2021/0249235 A1 8/2021 Kato et al.

FOREIGN PATENT DOCUMENTS

JP 2015-141968 A 8/2015
WO 2018180018 A1 10/2018

* cited by examiner

Start
S1
Carrying in substrate
S2
Supplying chemical liquid
S3
Supplying rinsing liquid
S4
Supplying drying liquid
S5
Drying substrate
S6
Carrying out substrate
End S1
S2
S3
S4
S5
S6
22A−1
22A−2
22A−3
22B−1
22B−2
22B−3
Clamping
Releasing
Clamping
Releasing
Clamping
Releasing
Clamping
Releasing
Etching
Cleaning

FIG. 9B

SUBSTRATE PROCESSING METHOD AND SUBSTRATE PROCESSING APPARATUS

CROSS-REFERENCE TO RELATED APPLICATION

The present application is a divisional of U.S. patent application Ser. No. 17/443,286, filed Jul. 23, 2021, which claims the benefit of priority from Japanese Patent Application No. 2020-131883, filed on Aug. 3, 2020, each of which is hereby incorporated herein by reference in its entirety.

TECHNICAL FIELD

The present disclosure relates to a substrate processing method and a substrate processing apparatus.

BACKGROUND

A substrate processing apparatus disclosed in Patent Document 1 performs a process on front and rear surfaces of a substrate, such as a semiconductor wafer, while rotating the substrate in a horizontal plane. The substrate is slidably held by a plurality of substrate support members. The plurality of substrate support members rotate together with a spin base. The substrate slides on the plurality of substrate support members at a constant acceleration/deceleration or by the supply of liquid, causing a difference in rotational speed between the substrate and the spin base. Thus, the substrate rotates relative to the spin base.

PRIOR ART DOCUMENT

Patent Document

Patent Document 1: Japanese Laid-Open Patent Publication No. 2002-093891

SUMMARY

A substrate processing apparatus according to one aspect of the present disclosure includes: a holder configured to hold a substrate horizontally; a rotator configured to rotate the holder; a liquid supplier configured to supply a liquid to the substrate that is horizontally held by the holder; and a controller configured to control the holder, the rotator, and the liquid supplier. The holder includes a turntable configured to be rotated by the rotator, at least one first clamper configured to be rotated together with the turntable and moved between a clamping position at which the at least one first clamper clamps a peripheral edge of the substrate and a releasing position at which the at least one first clamper releases clamping the substrate, and at least one second clamper configured to be rotated with the turntable and moved between the clamping position and the releasing position independently of the at least one first clamper. The controller controls the at least one first clamper and the at least one second clamper to alternately clamp the peripheral edge of the substrate while the holder is being rotated by the rotator and the liquid is being supplied to the substrate held by the holder.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is an enlarged view of a portion in FIG. 1.

FIGS. 3A and 3B are cross-sectional views illustrating a holder according to an embodiment, in which FIG. 3A is a cross-sectional view illustrating a clamping position of a first clamper and FIG. 3B is a cross-sectional view illustrating a releasing position of the first clamper.

FIGS. 4A and 4B are plan views illustrating exemplary movements of the first clamper and a second clamper, in which FIG. 4A is a plan view illustrating a state in which both the first clamper and the second clamper are at the releasing position and FIG. 4B is a plan view illustrating a state in which one of the first clamper and the second clamper is at the clamping position and the other is at the releasing position.

FIGS. 5A and 5B are plan views illustrating exemplary movements of the first clamper and the second clamper, in which FIG. 5A is a plan view illustrating a state in which both the first clamper and the second clamper are at the clamping position and FIG. 5B is a plan view illustrating a state in which one of the first clamper and the second clamper is at the releasing position and the other is at the clamping position.

FIGS. 9A and 9B are cross-sectional views illustrating a holder according to a first modification, in which FIG. 9A is a cross-sectional view illustrating a clamping position of a first clamper and FIG. 9B is a cross-sectional view illustrating a releasing position of the first clamper.

FIGS. 10A and 10B are cross-sectional views illustrating a holder according to a second modification, in which FIG. 10A is a cross-sectional view illustrating a clamping position of a first clamper and FIG. 10B is a cross-sectional view illustrating a releasing position of the first clamper.

DETAILED DESCRIPTION

Figure 1:
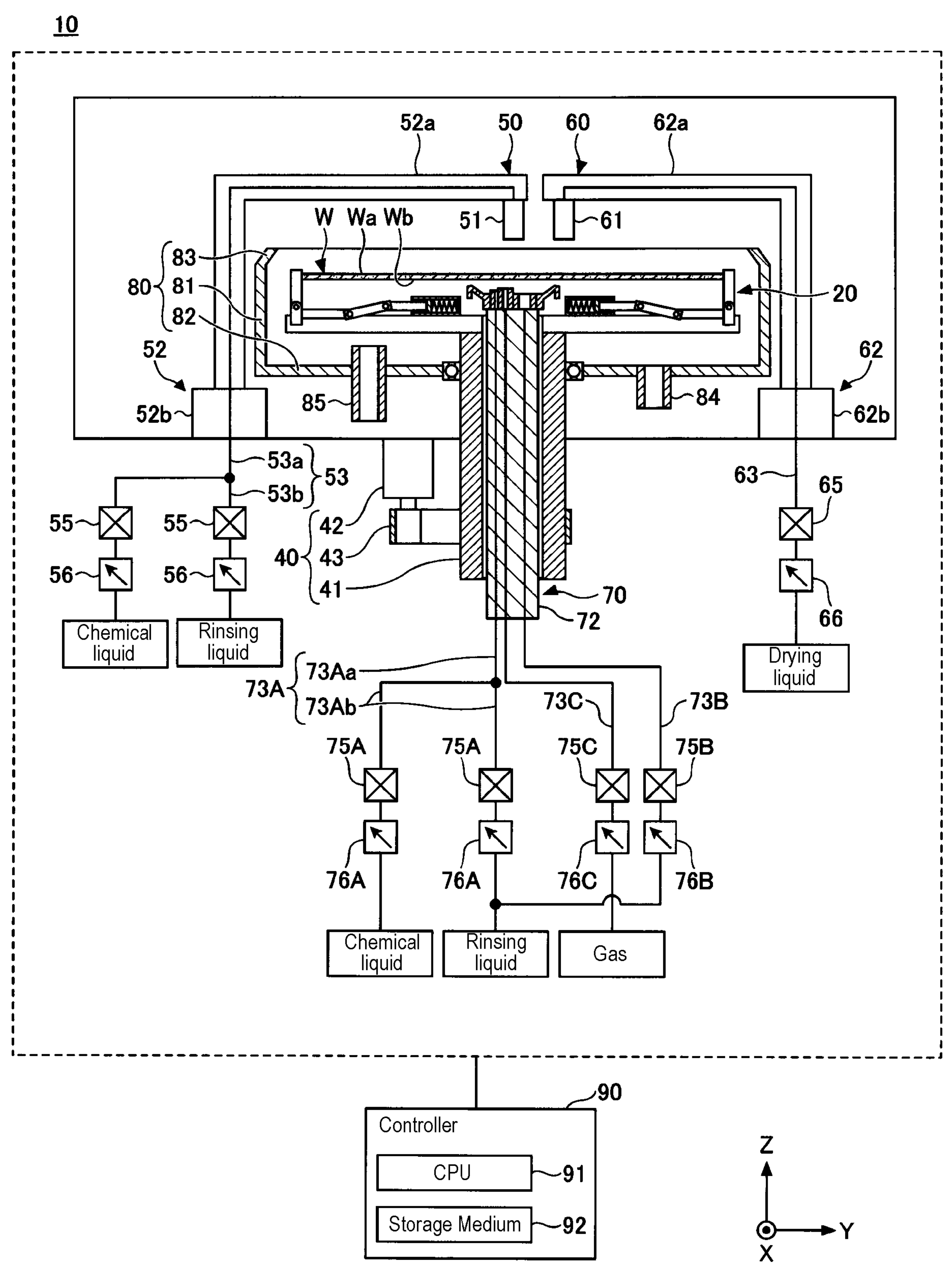
FIG. 1 is a cross-sectional view of a substrate processing apparatus according to an embodiment.

Hereinafter, embodiments of the present disclosure will be described with reference to the drawings. In each drawing, the same or corresponding components will be denoted by the same reference numerals, and a description thereof will be omitted. In the present specification, the X-axis direction, the Y-axis direction, and the Z-axis direction are perpendicular to each another. The X-axis direction and the Y-axis direction are horizontal directions, and the Z-axis direction is a vertical direction. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a substrate processing apparatus 10 will be described with reference to FIGS. 1 and 2. The substrate processing apparatus 10 processes a substrate W. The substrate W includes, for example, a semiconductor substrate, such as a silicon wafer or a compound semiconductor wafer, or a glass substrate. A conductive film, an insulating film, or the like is formed on the surface of the semiconductor substrate, the glass substrate, or the like. A plurality of films may be formed. The substrate W includes a device such as an electronic circuit on the surface thereof, and has a concavo-convex pattern (not illustrated). The substrate processing apparatus 10 includes, for example, a holder 20, a rotator 40, a first liquid supplier 50, a second liquid supplier 60, a third liquid supplier 70, a cup 80, and a controller 90.

The holder 20 holds the substrate W horizontally. The substrate W includes an upper surface Wa and a lower surface Wb. The upper surface Wa of the substrate W has a concavo-convex pattern (not illustrated). As illustrated in FIG. 2, the holder 20 includes a turntable 21 configured to be rotated by the rotator 40, a first clamper 22A configured to clamp the peripheral edge of the substrate W, and a second clamper 22B configured to clamp the peripheral edge of the substrate W. The first clamper 22A and the second clamper 22B are rotated together with the turntable 21 while clamping the substrate W.

The turntable 21 has a disk shape and is horizontally disposed below the substrate W. A hole is formed in the center of the turntable 21, and a liquid supply shaft 72 of the third liquid supplier 70 is disposed in the hole. The liquid supply shaft 72 is disposed inside a tubular rotation shaft 41. The rotation shaft 41 extends downwards from the center of the turntable 21. The rotation shaft 41 corresponds to a rotational central line of the turntable 21.

As illustrated in FIGS. 4A and 4B and FIGS. 5A and 5B, the first clamper 22A moves between a clamping position at which the peripheral edge of the substrate W is clamped and a releasing position at which the clamping of the substrate W is released. Three first clampers 22A are arranged at intervals along the peripheral edge of the substrate W. The number of the first clampers 22A may be three or more, and may be, for example, four. Three or more first clampers 22A are arranged at equal intervals along the peripheral edge of the substrate W. The load applied to the substrate W can be evenly distributed.

As illustrated in FIGS. 4A and 4B and FIGS. 5A and 5B, the second clamper 22B moves between the clamping position and the releasing position independently of the first clampers 22A. Three second clampers 22B are arranged at intervals along the peripheral edge of the substrate W. The number of the second clampers 22B may be three or more, and may be, for example, four. The three or more second clampers 22B are arranged at equal intervals along the peripheral edge of the substrate W. The load applied to the substrate W can be evenly distributed.

As will be described in detail later, the first clampers 22A and the second clampers 22B alternately clamp the peripheral edge of the substrate W. In addition, during the changing of the substrate W, both the first clampers 22A and the second clampers 22B clamp the substrate W at the same time so as not to drop the substrate W. In addition, during carrying-in/out of the substrate W, the first clampers 22A and the second clampers 22B release the clamping of the substrate W.

Three or more first clampers 22A and three or more second clampers 22B are alternately arranged along the peripheral edge of the substrate W. When the substrate W is clamped only by the first clampers 22A or when the substrate W is clamped only by the second clampers 22B, it is possible to clamp the substrate W in a balanced manner, and thus it is possible to suppress the deviation of the center of the substrate W.

Figure 2:
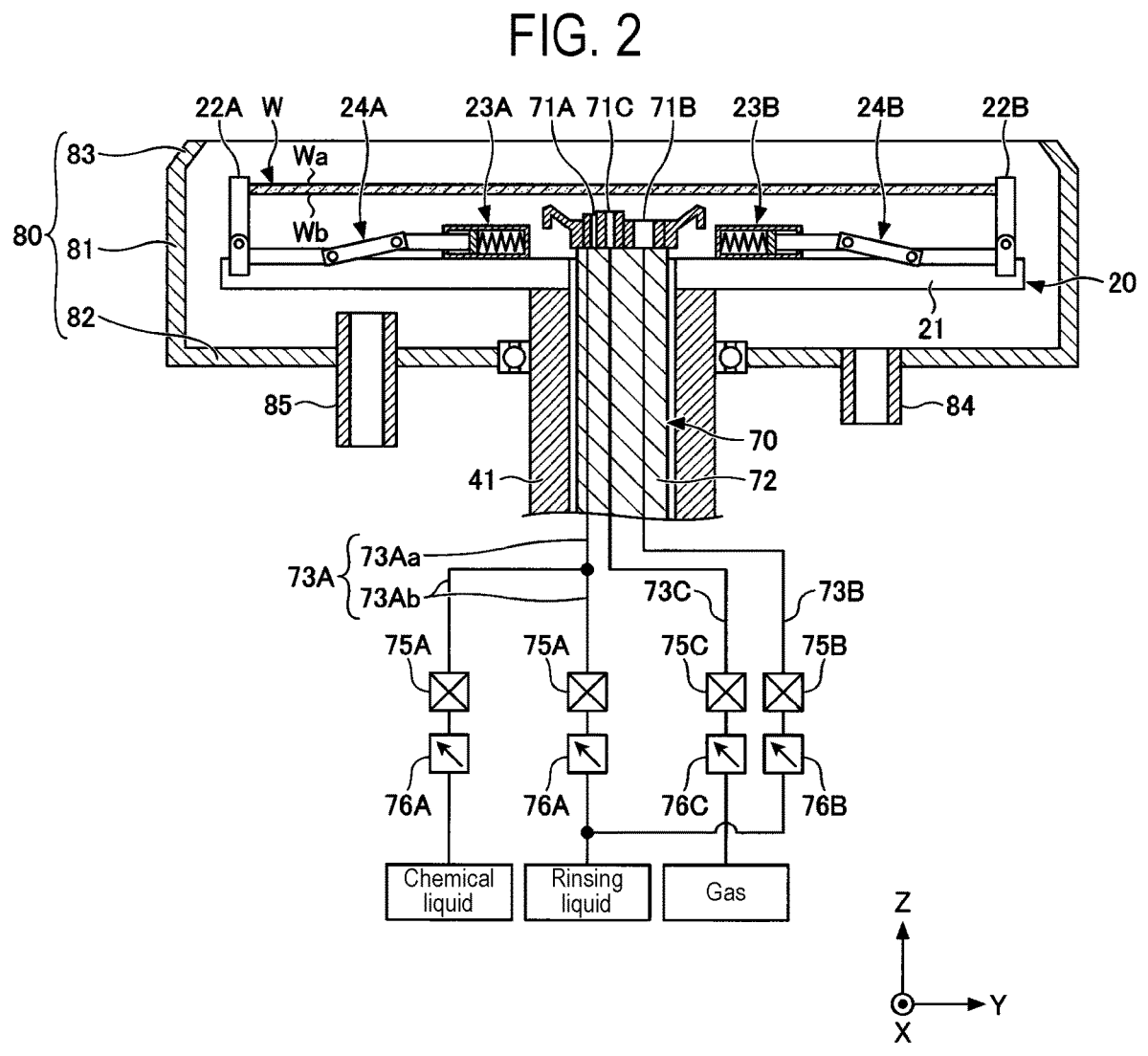

As illustrated in FIG. 2, the holder 20 includes a first driver 23A configured to move the first clamper 22A between the clamping position and the releasing position, and a first transmitter 24A configured to transmit a driving force of the first driver 23B to the first clamper 22A. In the present embodiment, the first driver 23A and the first transmitter 24A are rotated together with the turntable 21. As will be described in detail later, centrifugal force may also be used to drive the first clamper 22A. A plurality of first driver 23A and a plurality of first transmitters 24A may be provided. The plurality of first clampers 22A may be individually moved.

In addition, the holder 20 includes a second driver 23B configured to move the second clamper 22B between the clamping position and the releasing position independently of the first clamper 22A, and a second transmitter 24B configured to transmit a driving force of the second driver 23B to the second clamper 22B. In the present embodiment, the second driver 23B and the second transmitter 24B are rotated together with the turntable 21. Centrifugal force may also be used to drive the second clamper 22B. A plurality of second drivers 23B and a plurality of second transmitters 24B may be provided. The plurality of second clampers 22B may be individually moved.

Figure 3A:
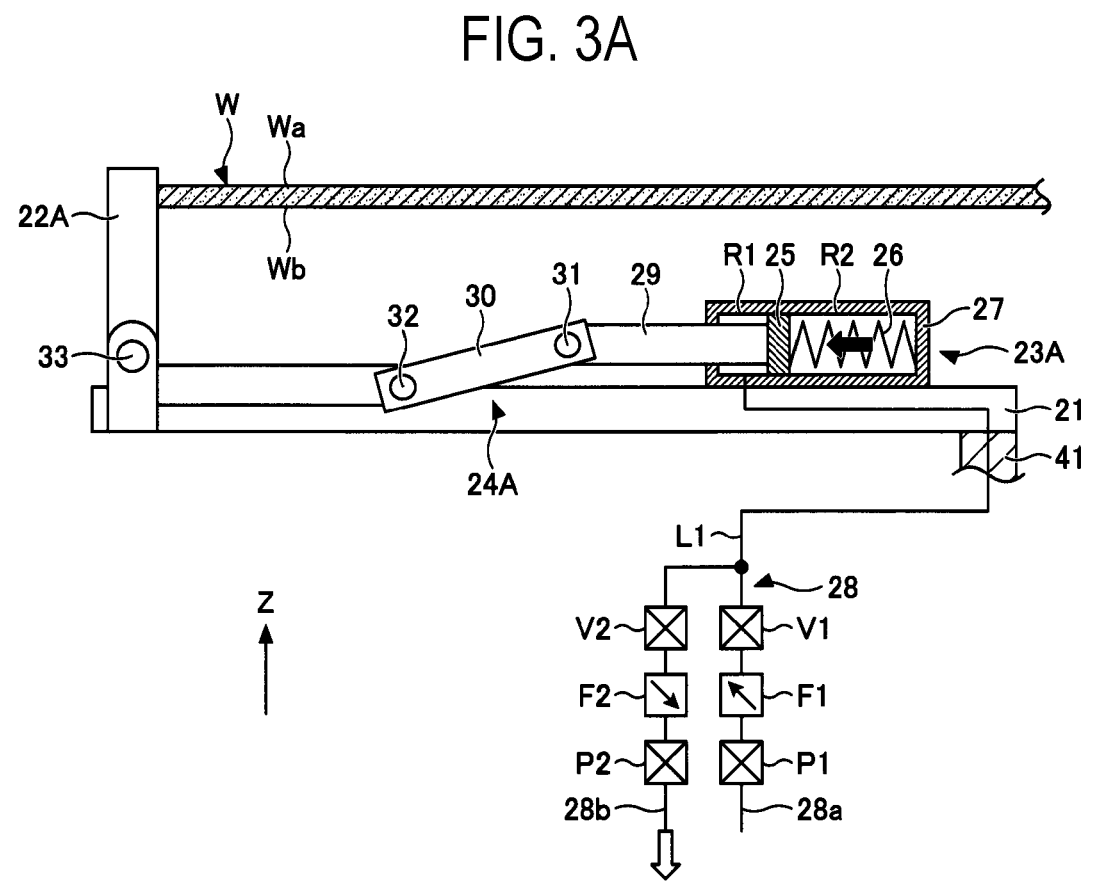
Figure 3B:
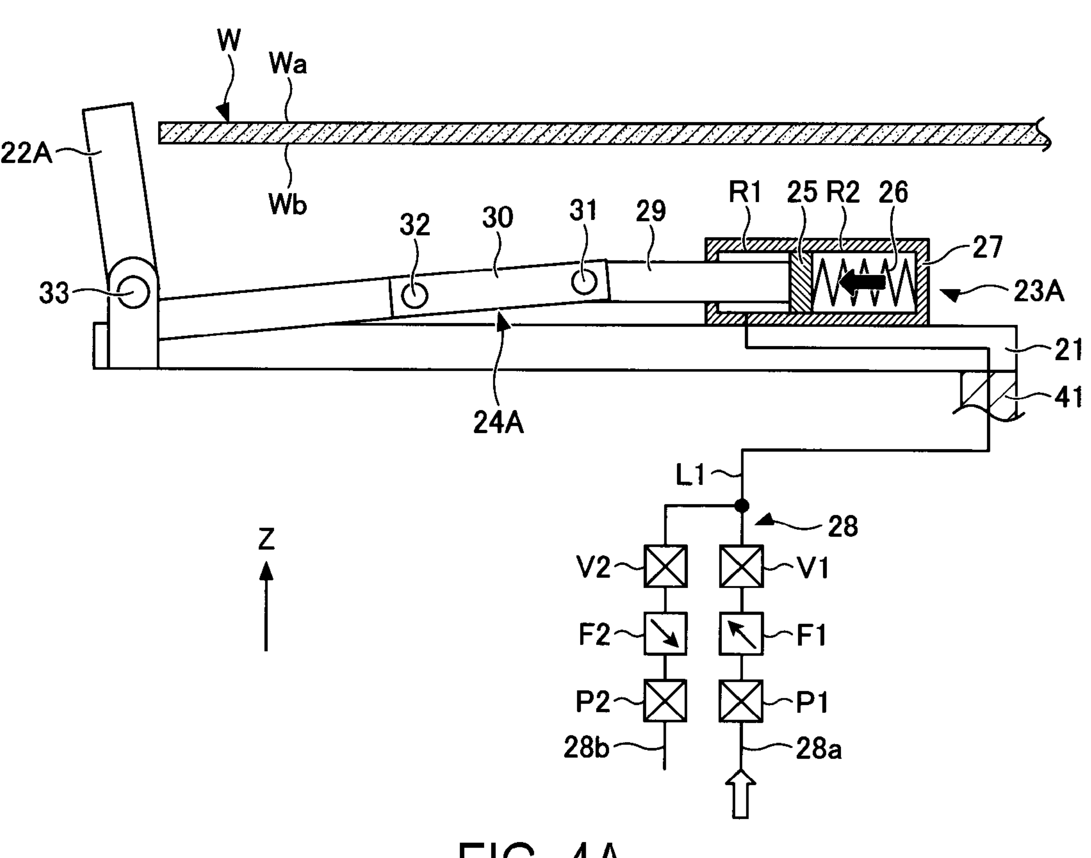
Figure 4A:
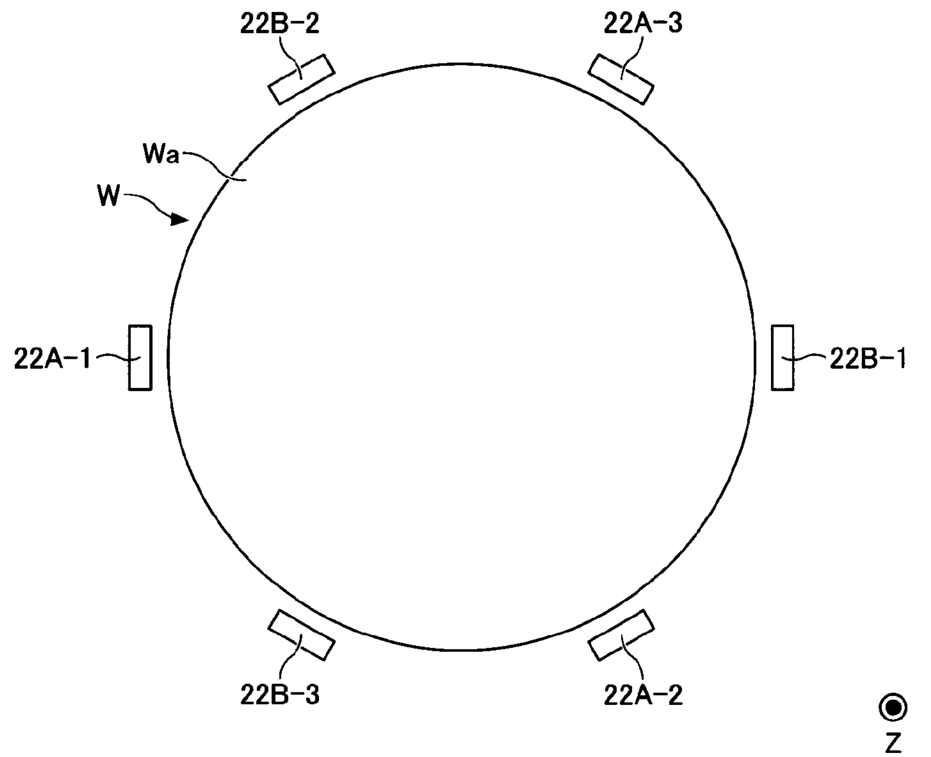
Figure 4B:
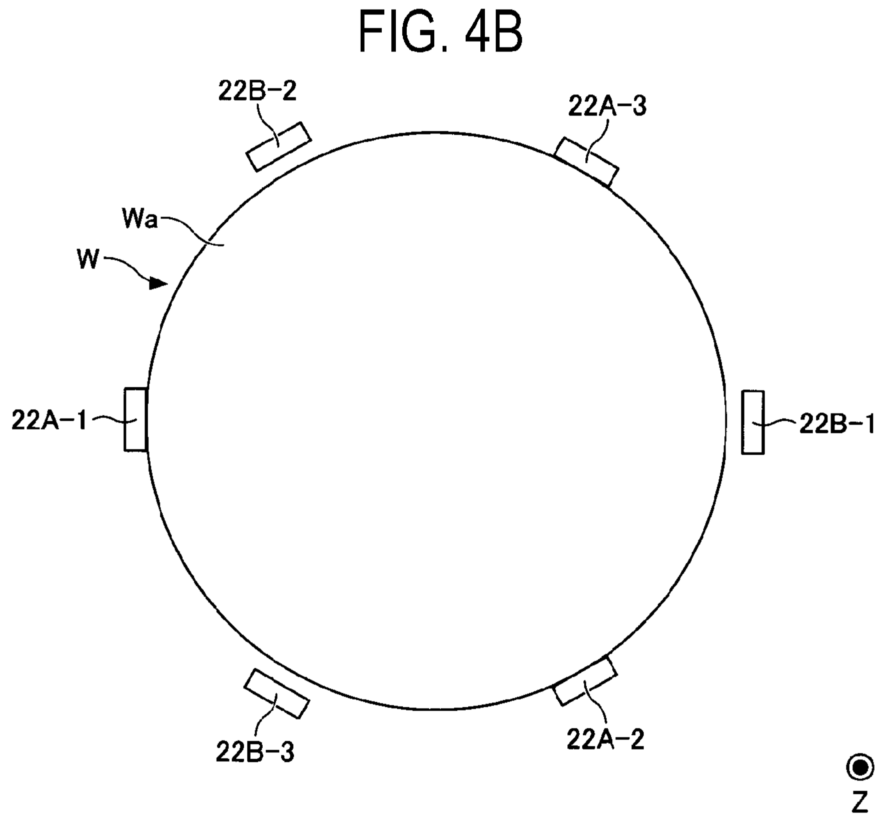
Figure 5A:
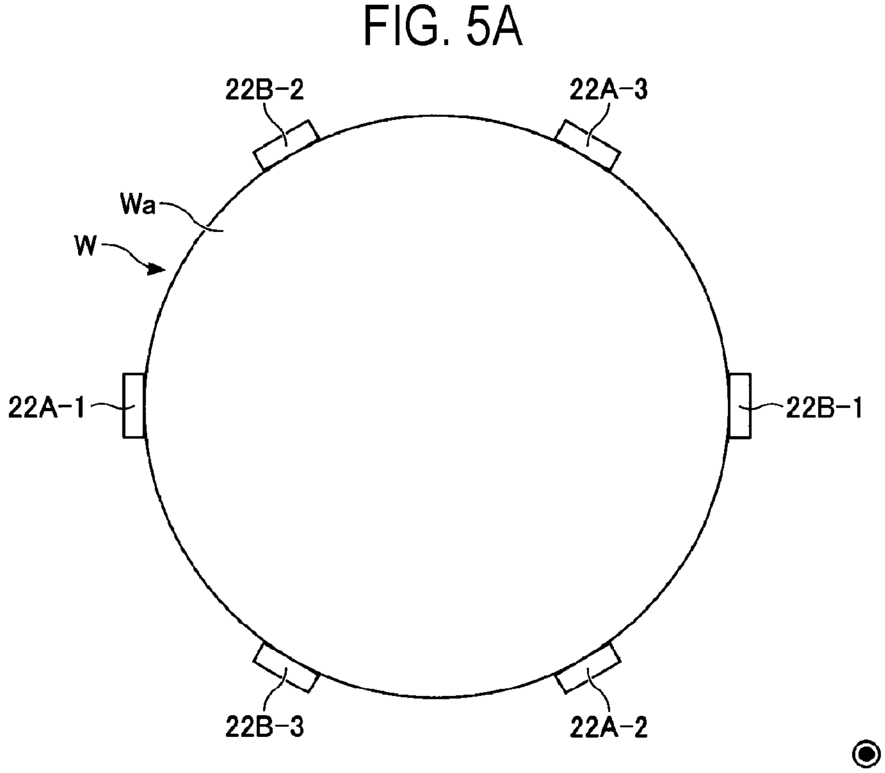
Figure 5B:
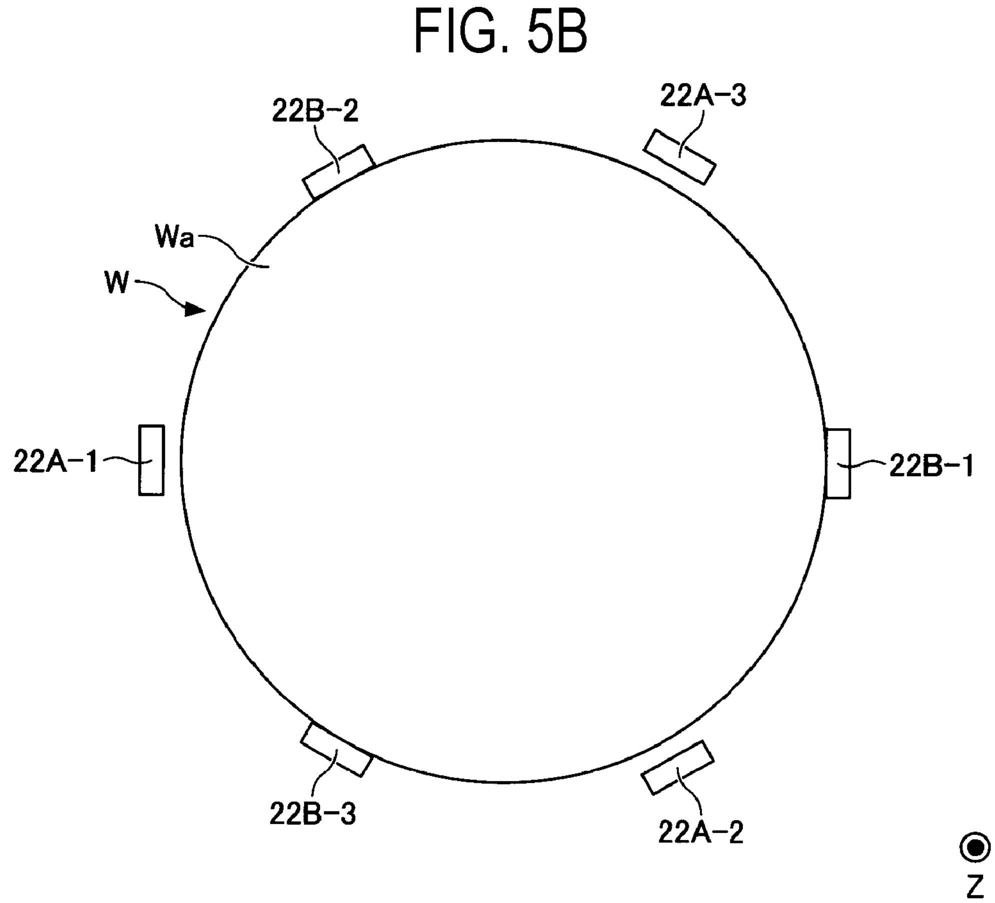

Next, details of the first driver 23A and the first transmitter 24A will be described with reference to FIGS. 3A and 3B. The second driver 23B is similar in configuration to the first driver 23A, and the second transmitter 24B is similar in configuration to the first transmitter 24A. Therefore, illustration and description of the second driver 23B and the second transmitter 24B will be omitted.

The first driver 23A includes a slider 25 that is movable in the radial direction of the substrate W. The radial direction of the substrate W is a direction orthogonal to the rotational central line of the turntable 21. The slider 25 rotates together with the turntable 21 and moves radially outward of the substrate W by centrifugal force. As a result, the first clamper 22A moves from the releasing position to the clamping position. By the centrifugal force acting on the slider 25, the first clamper 22A is capable of being pressed against the peripheral edge of the substrate W.

The first driver 23A includes a spring 26 that biases the slider 25 radially outward of the substrate W. By a restoring force of the spring 26, the first clamper 22A is capable of being pressed against the peripheral edge of the substrate W. Unlike a case where the pressure of a fluid, such as air, is used instead of the restoring force of the spring 26, even when the supply of pressure is interrupted due to a failure or the like during the rotation of the substrate W, the substrate W is capable of being continuously clamped by the restoring force of the spring. This makes it possible to prevent the substrate W from flying off due to the centrifugal force.

The first driver 23A includes a cylinder 27 configured to movably accommodate the slider 25. The cylinder 27 is fixed to the turntable 21 and rotates together with the turntable 21. The cylinder 27 guides the slider 25 in the radial direction of the substrate W. The slider 25 divides an internal space of the cylinder 27 into a first chamber R1 and a second chamber R2.

The first chamber R1 is hermetically sealed. An internal pressure of the first chamber R1 is adjusted by a first pressure adjustment mechanism 28. The first pressure adjustment mechanism 28 and the first chamber R1 are connected to each other by a first connection line L1. The first connection line L1 is formed in, for example, the turntable 21 and the rotation shaft 41, and is connected to the first pressure adjustment mechanism 28 via a rotary joint (not illustrated).

The first pressure adjustment mechanism 28 includes a pressure-increasing line 28*a* configured to increase the internal pressure of the first chamber R1. The pressure-increasing line 28*a* is provided with an opening/closing valve V1, a flow rate controller F1, a pressure controller P1, and the like. The opening/closing valve V1 opens/closes a flow path of the pressure-increasing line 28*a*. The flow rate controller F1 controls a flow rate of a fluid, such as air, supplied to the first chamber R1 when the internal pressure of the first chamber R1 is raised. The pressure controller P1 controls the internal pressure when the internal pressure of the first chamber R1 is increased.

In addition, the first pressure adjustment mechanism 28 includes a pressure-decreasing line 28*b* configured to decrease the internal pressure of the first chamber R1. The pressure-decreasing line 28*b* is provided with an opening/closing valve V2, a flow rate controller F2, a pressure controller P2, and the like. The opening/closing valve V2 opens/closes a flow path of the pressure-decreasing line 28*b*. The flow rate controller F2 controls a flow rate of a fluid, such as air, discharged from the first chamber R1 when the internal pressure of the first chamber R1 is decreased. The pressure controller P2 controls the internal pressure of the first chamber R1 when the internal pressure of the first chamber R1 is decreased.

Unlike the first chamber R1, the second chamber R2 is open without being sealed. An internal pressure of the second chamber R2 is equal to an ambient air pressure and is maintained constant. In the second chamber R2, the spring 26 is disposed in an elastically deformed state, for example, in a compressed state. The spring 26 biases the slider 25 radially outward of the substrate W by the restoring force thereof. The slider 25 is biased in a direction in which the volume of the first chamber R1 becomes smaller.

When the first pressure adjustment mechanism 28 supplies a fluid, such as air, to the first chamber R1 and raises the internal pressure of the first chamber R1, the slider 25 is moved against the restoring force of the spring 26. As a result, the first clamper 22A is moved from the clamping position to the releasing position and is separated from the substrate W. The load applied to the substrate W due to the release of stress at that time is determined by the supply pressure and supply speed of the fluid, and the like. When the controller 90 controls the driving force or the driving speed by controlling the pressure controller P1 or the flow rate controller F1, it is possible to suppress the load borne by the substrate W.

Meanwhile, when the first pressure adjustment mechanism 28 reduces the internal pressure of the first chamber R1 by discharging a fluid, such as air, from the first chamber R1, the slider 25 is pushed back by the restoring force of the spring 26. As a result, the first clamper 22A is moved from the releasing position to the clamping position and comes into contact with the substrate W. Impact generated at that time is determined by the restoring force of the spring, the discharge pressure and discharge speed of the fluid, and the like. When the controller 90 controls the driving force or the driving speed by controlling the pressure controller P2 or the flow rate controller F2, it is possible to suppress the impact.

According to the present embodiment, the restoring force of the spring 26 is used to move the first clamper 22A from the releasing position to the clamping position, but the pressure of the fluid is not used. Unlike the case of using the pressure of the fluid, it is possible to realize fail-safe. That is, even if the supply of pressure is interrupted due to a failure or the like during the rotation of the substrate W, the substrate W is capable of being continuously clamped by the restoring force of the spring. This makes it possible to prevent the substrate W from flying off due to the centrifugal force.

The first driver 23A includes a rod 29 that is moved in the horizontal direction together with the slider 25. The rod 29 is disposed on one side of the slider 25, penetrates the first chamber R1 of the cylinder 27, and protrudes from the cylinder 27. The longitudinal direction of the rod 29 corresponds to the movement direction of the slider 25.

The first transmitter 24A includes a link 30 having one end rotatably connected to the rod 29 and the other end rotatably connected to the first clamper 22A. The link 30 and the rod 29 are bent and stretched around a first pin 31. In addition, the link 30 and the first clamper 22A are bent and stretched around a second pin 32. The first pin 31 and the second pin 32 are arranged horizontally. The link 30 swings in a vertical plane to swing the first clamper 22A. The first clamper 22A is, for example, an L-shaped vertical plate.

The first clamper 22A swings around a horizontal third pin 33 held by the turntable 21, and swings in a vertical plane. Accordingly, it is also possible to move the first clamper 22A in the vertical direction. As a result, it is possible to change a range in which the liquid dropped horizontally from the substrate W comes into contact with the first clamper 22A, and it is possible to wash the first clamper 22A over a wide range using the liquid. The cleaning of the first clamper 22A is performed in the state in which the substrate W is clamped by the second clamper 22B.

As illustrated in FIG. 1, the rotator 40 rotates the holder 20. The rotator 40 includes, for example, the rotation shaft 41 extending downwards from the center of the turntable 21 of the holder 20, a rotation motor 42 configured to rotate the rotation shaft 41, and a belt 43 configured to transmit a rotational driving force of the rotation motor 42 to the rotation shaft 41. The rotation shaft 41 has a tubular shape, and a liquid supply shaft 72 is disposed inside the rotation shaft 41. The liquid supply shaft 72 is not rotated together with the rotation shaft 41.

The first liquid supplier 50 supplies the liquid to the upper surface Wa of the substrate W held by the holder 20. The first liquid supplier 50 includes, for example, a nozzle 51 configured to eject the liquid, a movement mechanism 52 configured to move the nozzle 51 in the radial direction of the substrate W, and a supply line 53 configured to supply the liquid to the nozzle 51. The nozzle 51 is provided above the holder 20 and ejects the liquid downwards.

The movement mechanism 52 includes, for example, a swivel arm 52*a* configured to hold the nozzle 51 and a swivel mechanism 52*b* configured to swivel the swivel arm 52*a*. The swivel mechanism 52*b* may also serve as a lifting mechanism for raising and lowering the swivel arm 52*a*. The swivel arm 52*a* is arranged horizontally, holds the nozzle 51 at one end thereof in the longitudinal direction, and is swiveled around a swivel shaft extending downwards from the other end in the longitudinal direction. In addition, the movement mechanism 52 may include a guide rail and a linear motion mechanism instead of the swivel arm 52*a* and the swivel mechanism 52*b*. The guide rail is arranged horizontally, and the linear motion mechanism moves the nozzle 51 along the guide rail.

The supply line 53 includes, for example, a common line 53*a* and a plurality of individual lines 53*b* connected to the common line 53*a*. The plurality of individual lines 53*b* are provided for respective types of liquids. The types of liquids include, for example, a chemical liquid and a rinsing liquid. The chemical liquid may be acidic, alkaline, or neutral. The acidic chemical liquid is, for example, dilute hydrofluoric acid (DHF) or the like. The alkaline chemical liquid is, for example, SC1 (an aqueous solution containing hydrogen peroxide and ammonium hydroxide) or the like. The neutral chemical liquid is functional water such as ozone water. The rinsing liquid is, for example, deionized water (DIW). An opening/closing valve 55 configured to open/close the flow path of liquid and a flow rate controller 56 configured to control a flow rate of the liquid are provided in each individual line 53*b*.

Although the chemical liquid and the rinsing liquid are ejected from one nozzle 51 in FIG. 1, they may be ejected from different nozzles 51. When a plurality of nozzles 51 is provided, the supply line 53 is provided for each nozzle 51.

The second liquid supplier 60 supplies a liquid to the upper surface Wa of the substrate W held by the holder 20, similarly to the first liquid supplier 50. The second liquid supplier 60 includes, for example, a nozzle 61 configured to eject the liquid, a movement mechanism 62 configured to move the nozzle 61 in the radial direction of the substrate W, and a supply line 63 configured to supply the liquid to the nozzle 61. The nozzle 61 is provided above the holder 20 and ejects the liquid downwards. The nozzle 61 of the second liquid supplier 60 and the nozzle 51 of the first liquid supplier 50 are moved independently of each other.

The movement mechanism 62 includes, for example, a swivel arm 62*a* configured to hold the nozzle 61 and a swivel mechanism 62*b* configured to swivel the swivel arm 62*a*. The swivel mechanism 62*b* may also serve as a lifting mechanism for raising and lowering the swivel arm 62*a*. The swivel arm 62*a* is arranged horizontally, holds the nozzle 61 at one end thereof in the longitudinal direction, and is swiveled around a swivel shaft extending downwards from the other end in the longitudinal direction. In addition, the movement mechanism 62 may include a guide rail and a linear motion mechanism instead of the swivel arm 62*a* and the swivel mechanism 62*b*. The guide rail is arranged horizontally, and the linear motion mechanism moves the nozzle 61 along the guide rail.

The supply line 63 supplies a drying liquid to the nozzle 61. As the drying liquid, a liquid having a surface tension lower than that of the rinsing liquid may be used. The drying liquid is an organic solvent such as isopropyl alcohol (IPA). It is possible to dry the substrate W after replacing a liquid film on the upper surface Wa of the substrate W from the liquid film of the rinsing liquid to the liquid film of the drying liquid. When the substrate W is dried, it is possible to suppress the collapse of the concavo-convex pattern due to the surface tension.

The concavo-convex pattern is formed in advance in the upper surface Wa of the substrate W. The concavo-convex pattern may not be formed in advance in the lower surface Wb of the substrate W. Therefore, it may be sufficient for the drying liquid to be supplied to the upper surface Wa of the substrate W, and the drying liquid may not be supplied to the lower surface Wb of the substrate W. An opening/closing valve 65 configured to open/close a flow path of the drying liquid and a flow rate controller 66 configured to control a flow rate of the drying liquid are provided in the supply line 63.

In the present embodiment, when the liquid film of the rinsing liquid is replaced with the liquid film of the drying liquid, the supply position of the rinsing liquid and the supply position of the drying liquid are moved independently of each other so that the liquid film is not interrupted. Specifically, the supply position of the rinsing liquid is moved radially outward of the substrate W while the supply position of the drying liquid is fixed at the center of the upper surface Wa of the substrate W. Therefore, the second liquid supplier 60 and the first liquid supplier 50 are provided separately.

However, depending on the size and shape of the concavo-convex pattern of the substrate W, the material of the substrate W, and the like, it may not necessary to move the supply position of the rinsing liquid radially outward of the substrate W in the state in which the supply position of the drying liquid is fixed at the center of the upper surface Wa of the substrate W. In this case, the second liquid supplier 60 may not be provided, and the nozzle 51 of the first liquid supplier 50 may eject the drying liquid.

Unlike the first liquid supplier 50 and the second liquid supplier 60, the third liquid supplier 70 supplies the liquid to the lower surface Wb of the substrate W held by the holder 20. As illustrated in FIG. 2, the third liquid supplier 70 includes a plurality of nozzles 71A, 71B, and 71C that are arranged to face the center of the lower surface Wb of the substrate W held by the holder 20. The center of the lower surface is, for example, a region within a distance of 50 mm from the center of the lower surface Wb.

Each of the plurality of nozzles 71A, 71B, and 71C is formed on the upper surface of the liquid supply shaft 72, and ejects a fluid upward. The nozzle 71A discharges, for example, the chemical liquid and the rinsing liquid upwards. The nozzle 71B ejects, for example, a rinsing liquid, upwards. The nozzle 71C ejects a gas, such as a $N_2$ gas, upwards.

The third liquid supplier 70 has the liquid supply shaft 72. The liquid supply shaft 72 is disposed inside the rotation shaft 41 and is not rotated together with the rotation shaft 41. The liquid supply shaft 72 is provided with a plurality of supply lines 73A, 73B, and 73C connected to the respective nozzles 71A, 71B, and 71C.

The supply line 73A is connected to the nozzle 71A and supplies the chemical liquid and the rinsing liquid to the nozzle 71A. The supply line 73A includes, for example, a common line 73Aa and a plurality of individual lines 73Ab connected to the common line 73Aa. The individual lines 73Ab are provided for respective types of liquids. An opening/closing valve 75A configured to open/close a flow path of the liquid and a flow rate controller 76A configured to control a flow rate of the liquid are provided in each individual line 73Ab.

Similarly, the supply line 73B is connected to the nozzle 71B and supplies the rinsing liquid to the nozzle 71B. An opening/closing valve 75B configured to open/close a flow path of the rinsing liquid and a flow rate controller 76B configured to control a flow rate of the rinsing liquid are provided in the supply line 73B. In FIG. 2, one common source is provided as a source of the rinsing liquid of the supply line 73B and a source of the rinsing liquid of the supply line 73A, but separate ones may be provided.

In addition, the supply line 73C is connected to the nozzle 71C and supplies a gas, such as a $N_2$ gas, to the nozzle 71C. An opening/closing valve 75C configured to open/close a flow path of the gas and a flow rate controller 76C for controlling a flow rate of the gas are provided in the supply line 73C.

As illustrated in FIG. 1, the cup 80 collects various liquids supplied to the substrate W. The cup 80 includes a cylindrical portion 81, a bottom cover portion 82, and an inclined portion 83. The cylindrical portion 81 has an inner diameter larger than that of the substrate W and is arranged vertically. The bottom cover portion 82 closes a lower end opening of the cylindrical portion 81. The inclined portion 83 is formed over the entire circumference of the upper end of the cylindrical portion 81, and is inclined upwards radially inward of the cylindrical portion 81. The bottom cover portion 82 is provided with a drainage pipe 84 configured to discharge the liquid accumulated inside the cup 80 and an exhaust pipe 85 configured to discharge the gas accumulated inside the cup 80.

The controller 90 controls the holder 20, the rotator 40, the first liquid supplier 50, the second liquid supplier 60, and the third liquid supplier 70. The controller 90 is, for example, a computer, and includes a central processing unit (CPU) 91 and a storage medium 92 such as a memory. The storage medium 92 stores a program for controlling various processes executed in the substrate processing apparatus 10. The controller 90 controls the operation of the substrate processing apparatus 10 by causing the CPU 91 to execute the program stored in the storage medium 92.

Figure 6:
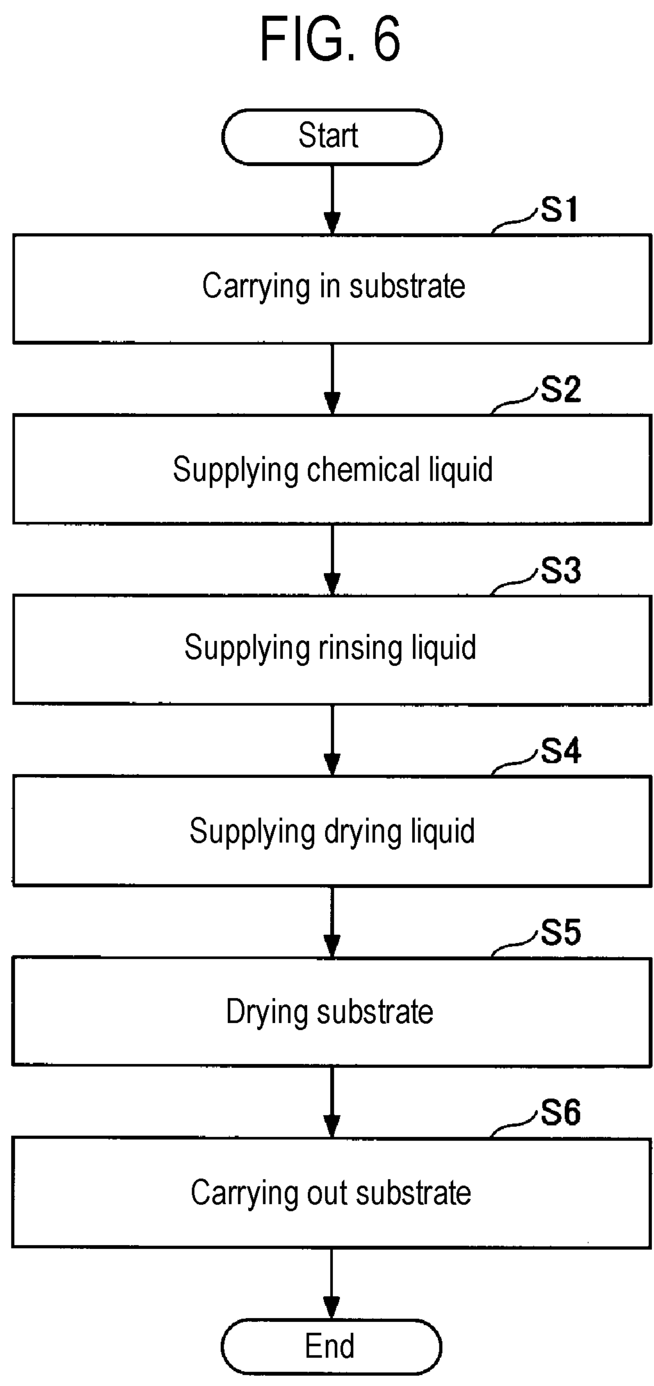
FIG. 6 is a flowchart illustrating a substrate processing method according to an embodiment.

Next, a substrate processing method will be described with reference to FIGS. 6 and 7. Each of steps S1 to S6 illustrated in FIG. 6 is performed under the control of the controller 90. In steps S2 to S5, the substrate W is held horizontally and is rotated about the vertical rotation shaft 41. In addition, in steps S2 to S5, the nozzle 71C of the third liquid supplier 70 continues to eject a gas.

First, in step S1, a transfer device (not illustrated) carries the substrate W into the substrate processing apparatus 10. The transfer device places the substrate W on the holder 20 and is then retracted from the substrate processing apparatus 10. The holder 20 receives the substrate W from the transfer device and holds the substrate W. As illustrated in FIG. 7, for example, the first clampers 22A clamp the substrate W. The second clampers 22B do not have to clamp the substrate W.

Next, in step S2, a chemical liquid is supplied to both the upper surface Wa and the lower surface Wb of the substrate W. The chemical liquid is supplied from the nozzle 51 of the first liquid supplier 50 to the center of the upper surface Wa of the substrate W, and is spread over the entire upper surface by centrifugal force so as to process the entire upper surface. In addition, the chemical liquid is supplied from the nozzle 71A of the third liquid supplier 70 to the center of the lower surface Wb of the substrate W, and is spread over the entire lower surface by centrifugal force so as to process the entire lower surface.

Figure 7:
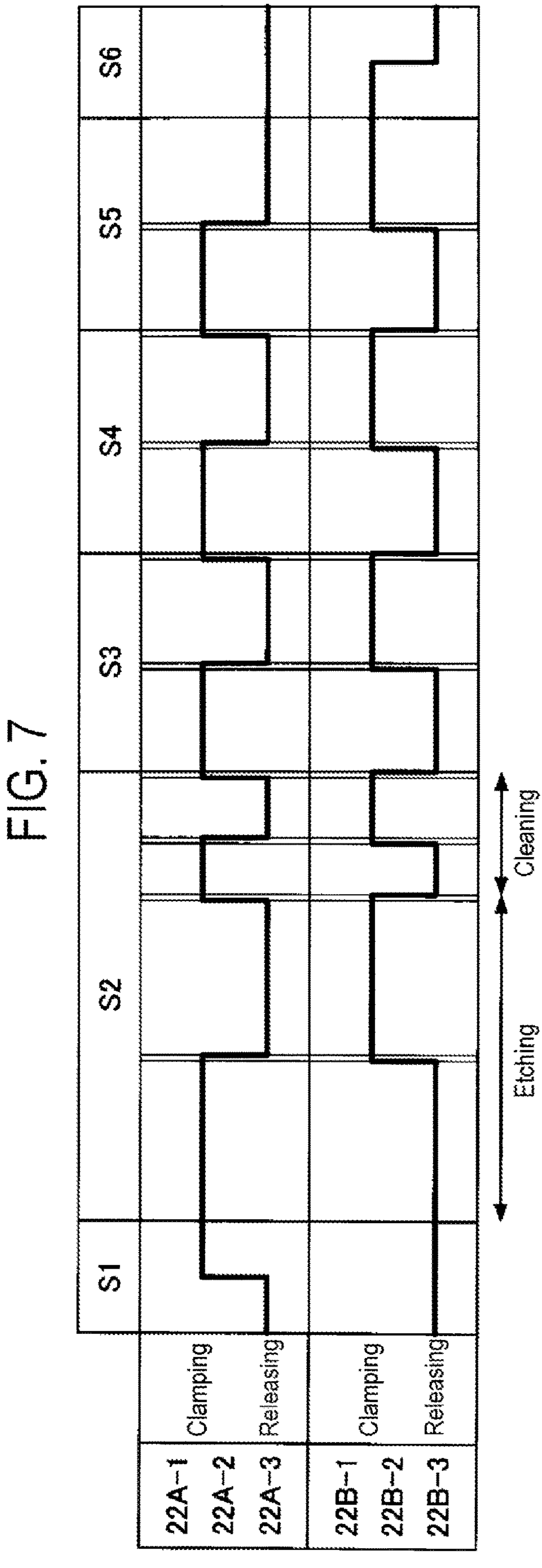
FIG. 7 is a timing chart illustrating an example of an operation of changing a substrate clamping manner.

In step S2, as illustrated in FIG. 7, the first clampers 22A and the second clampers 22B alternately clamp the substrate W. For example, first, in the state in which only the first clampers 22A clamp the substrate W, the chemical liquid is supplied to the substrate W to etch the substrate W. Components eluted by the chemical liquid on the substrate W are centrifugally dropped from the substrate W together with the chemical liquid and are collected in the cup 80.

Since the first clampers 22A are in contact with the substrate W, in the vicinity of the first clampers 22A, a liquid pool is generated and etching is hindered. Therefore, the manner of clamping the substrate W is changed. First, both the first clampers 22A and the second clampers 22B simultaneously clamp the substrate W, and then only the second clampers 22B clamp the substrate W.

In the state in which only the second clampers 22B clamp the substrate W, a chemical liquid is supplied to the substrate W. Since no liquid pool is generated in the vicinity of the first clampers 22A, etching proceeds. Therefore, it is possible to suppress etching unevenness. During the etching of the substrate W, the time taken to clamp the substrate W only by the first clampers 22A and the time taken to clamp the substrate W only by the second clampers 22B are approximately the same.

According to the present embodiment, the manner of clamping the substrate W is switched between the first clampers 22A and the second clampers 22B in order to suppress the processing unevenness of the substrate W. Therefore, unlike Patent Document 1, it is not necessary to make a difference in the number of rotations between the substrate W and the holder 20. According to the present embodiment, the first clampers 22A and the second clampers 22B are rotated together with the holder 20. Therefore, it is possible to suppress wear of the substrate W and the holder 20, and thus it is possible to suppress generation of particles due to the wear. In addition, since it is not necessary to increase or decrease the number of rotations of the holder 20 as in Patent Document 1 during the supply of the chemical liquid, it is possible to maintain the number of rotations of the substrate W constant.

As illustrated in FIG. 7, when the etching of the substrate W is completed, the manner of clamping the substrate W is changed again. Specifically, first, both the first clampers 22A and the second clampers 22B simultaneously clamp the substrate W, and then only the first clampers 22A clamp the substrate W. It is possible to return the distribution of stress applied to the substrate W to the original distribution.

The chemical liquid is supplied to the substrate W even after the etching of the substrate W is completed. Since it is possible to cause the chemical liquid containing almost no impurities, such as the components eluted from the substrate W, to flow over the first clampers 22A and the second clampers 22B, it is possible to remove foreign substances. However, the first clampers 22A are in contact with the substrate W, and liquid pools are generated in the vicinity of the first clampers 22A, which hinders the removal of foreign substances.

Therefore, the manner of clamping the substrate W is changed. First, both the first clampers 22A and the second clampers 22B simultaneously clamp the substrate W, and then only the second clampers 22B clamp the substrate W. Since no liquid pool is generated in the vicinity of the first clampers 22A, the removal of foreign substances proceeds. Therefore, it is possible to suppress uneven cleaning. During cleaning of the first clampers 22A and the second clampers 22B, the time taken to clamp the substrate W only by the first clampers 22A and the time taken to clamp the substrate W only by the second clampers 22B are approximately the same.

While only the second clampers 22B clamp the substrate W, each of the first clampers 22A is temporarily stopped at the releasing position, but may be temporarily stopped at both an intermediate position between the releasing position and the clamping position, and the releasing position. In the latter case, it is possible to change a range in which the chemical liquid that drops off horizontally from the substrate W comes into contact with the first clampers 22A. Accordingly, it is possible to clean the first clampers 22A over a wide range using a liquid.

Similarly, while only the first clampers 22A clamp the substrate W, each of the second clampers 22B is temporarily stopped at the releasing position, but may be temporarily stopped at both the intermediate position between the releasing position and the clamping position, and the releasing position. In the latter case, it is possible to change a range in which the chemical liquid that drops off horizontally from the substrate W comes into contact with the second clampers 22B. Accordingly, it is possible to clean the second clampers 22B over a wide range using a liquid.

After cleaning the first clampers 22A and the second clampers 22B, the manner of clamping the substrate W may be changed again, as illustrated in FIG. 7. Before initiating step S3, it is possible to return the distribution of stress applied to the substrate W to the original distribution.

Subsequently, in step S3, the rinsing liquid is supplied to both the upper surface Wa and the lower surface Wb of the substrate W, and the liquid film of the chemical liquid formed in step S2 is replaced with a liquid film of the rinsing liquid. The rinsing liquid is supplied from the nozzle 51 of the first liquid supplier 50 to the center of the upper surface Wa of the substrate W, is spread over the entire upper surface by centrifugal force, washes away the chemical liquid remaining on the upper surface Wa, and forms the liquid film of the rinsing liquid on the upper surface Wa. In addition, the rinsing liquid is supplied from the nozzle 71A of the third liquid supplier 70 to the center of the lower surface Wb of the substrate W, is spread over the entire lower surface by centrifugal force, washes away the chemical liquid remaining on the lower surface Wb, and forms the liquid film of the rinsing liquid on the lower surface Wb.

In step S3, as illustrated in FIG. 7, the first clampers 22A and the second clampers 22B alternately clamp the substrate W. For example, first, in the state in which only the first clampers 22A clamp the substrate W, the rinsing liquid is supplied to the substrate W to wash away the chemical liquid remaining on the substrate W.

Since the first clampers 22A are in contact with the substrate W, in the vicinity of each first clamper 22A, a liquid pool is generated and replacement of the chemical liquid with the rinsing liquid is hindered. Therefore, the manner of clamping the substrate W is changed. Specifically, first, both the first clampers 22A and the second clampers 22B simultaneously clamp the substrate W, and then only the second clampers 22B clamp the substrate W.

In the state in which only the second clampers 22B clamp the substrate W, a rinsing liquid is supplied to the substrate W. Since no liquid pool is generated in the vicinity of each first clamper 22A, the replacement of the chemical liquid with the rinsing liquid proceeds. Therefore, it is possible to suppress uneven replacement.

Thereafter, as illustrated in FIG. 7, the manner of clamping the substrate W may be changed again before initiating step S4. It is possible to return the distribution of stress applied to the substrate W to the original distribution.

Subsequently, in step S4, a drying liquid is supplied to the upper surface Wa of the substrate W, and the liquid film of the rinsing liquid formed in step S3 is replaced with a liquid film of the drying liquid. The drying liquid is supplied from the nozzle 61 of the second liquid supplier 60 to the center of the upper surface Wa of the substrate W, is spread over the entire upper surface by centrifugal force, washes away the rinsing liquid remaining on the upper surface Wa, and forms the liquid film of the drying liquid on the upper surface Wa.

In step S4, as illustrated in FIG. 7, the first clampers 22A and the second clampers 22B alternately clamp the substrate W. For example, first, in the state in which only the first clampers 22A clamp the substrate W, the drying liquid is supplied to the substrate W to replace the rinsing liquid remaining on the substrate W.

Since the first clampers 22A are in contact with the substrate W, in the vicinity of each first clamper 22A, a liquid pool is generated and replacement of the rinsing liquid with the drying liquid is hindered. Therefore, the manner of clamping the substrate W is changed. Specifically, first, both the first clampers 22A and the second clampers 22B simultaneously clamp the substrate W, and then only the second clampers 22B clamp the substrate W.

In the state in which only the second clampers 22B clamp the substrate W, the drying liquid is supplied to the substrate W. Since no liquid pool is generated in the vicinity of each first clamper 22A, the replacement of the rinsing liquid with the drying liquid proceeds. Therefore, it is possible to suppress uneven replacement.

Thereafter, as illustrated in FIG. 7, the manner of clamping the substrate W may be changed again before initiating step S5. It is possible to return the distribution of stress applied to the substrate W to the original distribution.

Subsequently, in step S5, the substrate W is held horizontally and rotated to be dried. No liquid is supplied to the substrate W, and the drying liquid remaining on the substrate W drops off, so that the substrate W is dried.

In step S5, as illustrated in FIG. 7, the first clampers 22A and the second clampers 22B alternately clamp the substrate W. For example, first, the substrate W is rotated in the state in which only the first clampers 22A clamp the substrate W, and the drying liquid remaining on the substrate W drops off.

Since the first clampers 22A are in contact with the substrate W, and in the vicinity of each first clamper 22A, a liquid pool is generated and the drying liquid tends to remain. Therefore, the manner of clamping the substrate W is changed. Specifically, first, both the first clampers 22A and the second clampers 22B simultaneously clamp the substrate W, and then only the second clampers 22B clamp the substrate W.

The substrate W is rotated in the state in which only the second clampers 22B clamp the substrate W, and the drying liquid remaining on the substrate W drops off. Since no liquid pool is generated in the vicinity of the first clampers 22A, drying proceeds. Therefore, it is possible to suppress uneven drying.

Subsequently, in step S6, the holder 20 releases the holding of the substrate W, and then a transfer device (not illustrated) receives the substrate W from the holder 20 and carries the same out of the substrate processing apparatus 10. Thereafter, this process is terminated.

Figure 8:
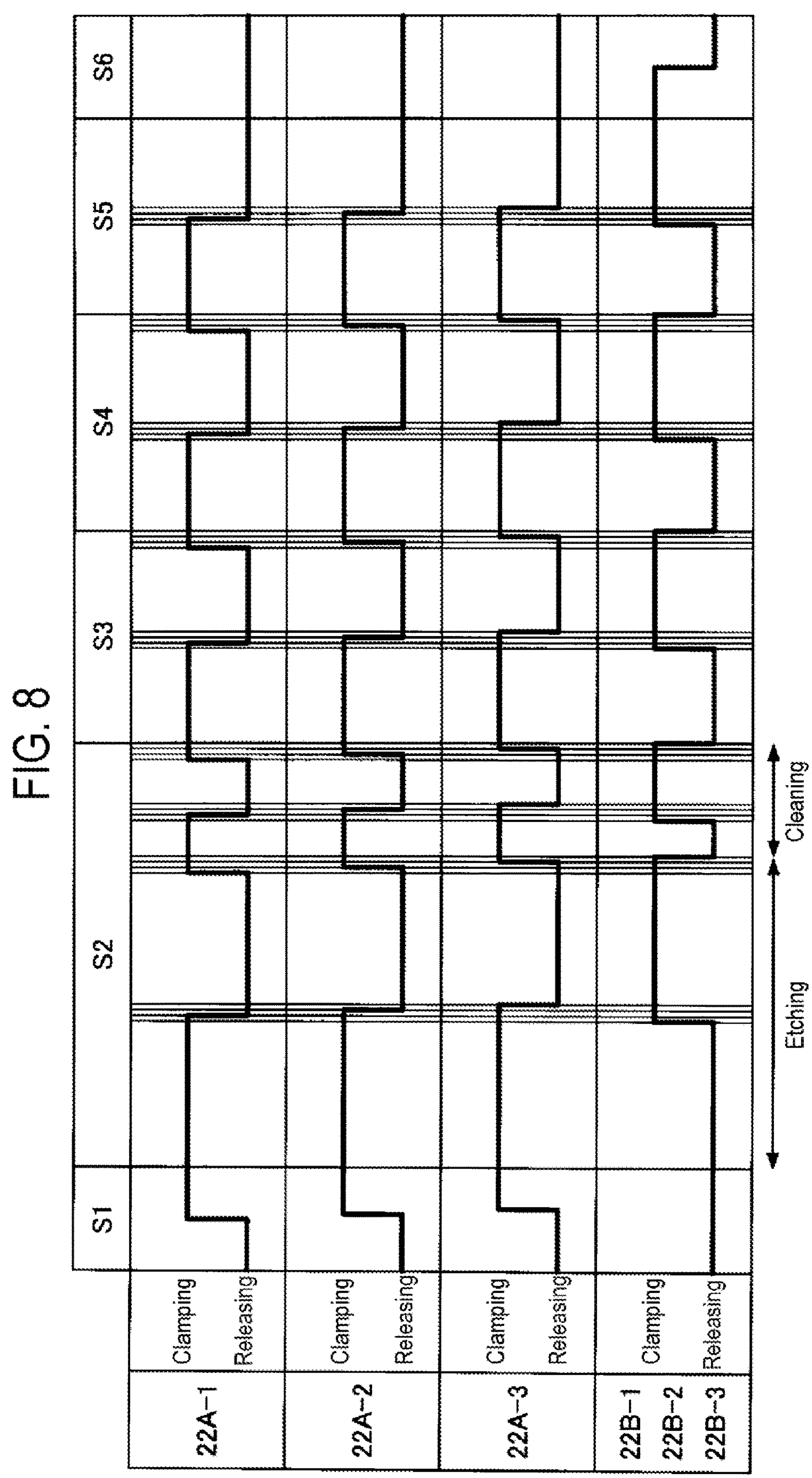
FIG. 8 is a timing chart illustrating another example of the operation of changing the substrate clamping manner.

Next, with reference to FIG. 8, a modification of an operation of changing a manner of clamping the substrate W will be described. In the embodiment described above, as illustrated in FIG. 7, the controller 90 moves three first clampers 22A-1, 22A-2, and 22A-3 at the same time. On the other hand, in this modification, as illustrated in FIG. 8, the controller 90 moves the three first clampers 22A-1, 22A-2, and 22A-3 in a predetermined order. Differences will be mainly described below.

For example, in the state in which the substrate W is held by three second clampers 22B-1, 22B-2, and 22B-3, the controller 90 moves the three first clampers 22A-1, 22A-2, and 22A-3 from the releasing position to the clamping position in a predetermined order. Since it is possible to gradually increase the total load applied to the substrate W, it is possible to suppress damage to the substrate W.

In addition, in the state in which the substrate W is held by the three second clampers 22B-1, 22B-2, and 22B-3, the controller 90 moves the three first clampers 22A-1, 22A-2, and 22A-3 from the clamping position to the releasing position in a predetermined order. Since it is possible to gradually decrease the total load applied to the substrate W, it is possible to suppress damage to the substrate W.

In addition, although not illustrated, in the state in which the substrate W is held by the three first clampers 22A-1, 22A-2, and 22A-3, the controller 90 may move the three second clampers 22B-1, 22B-2, and 22B-3 from the releasing position to the clamping position or from the clamping position to the releasing position in a predetermined order.

Figure 9A:
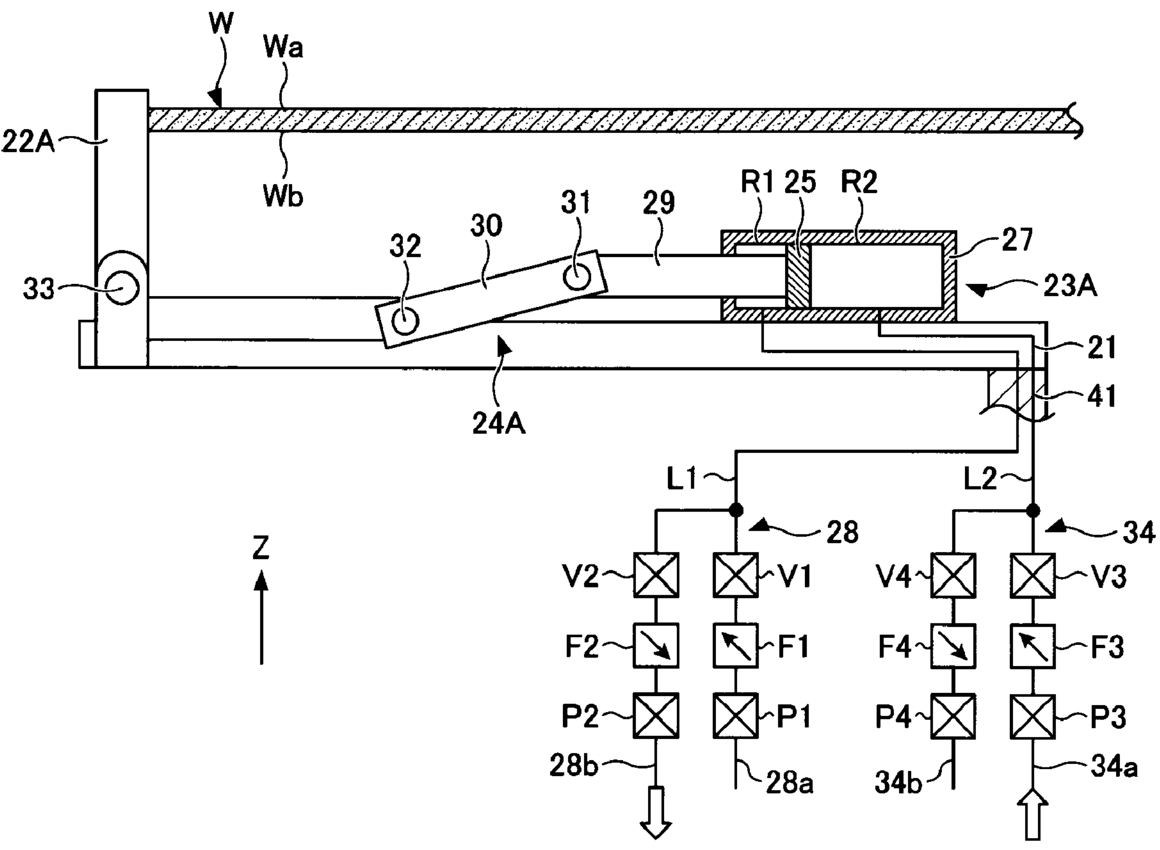
Figure 9B:
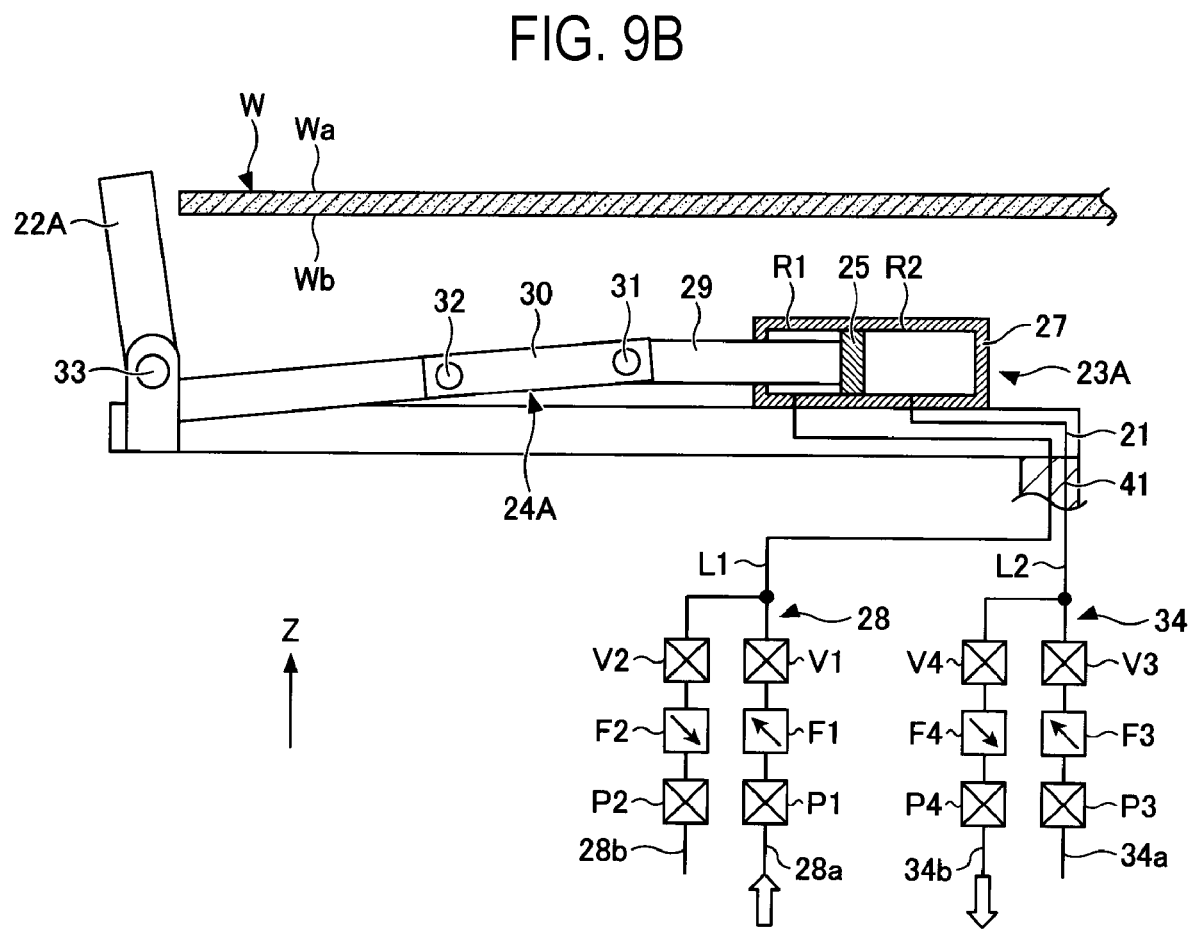

Next, with reference to FIGS. 9A and 9B, the holder 20 according to a first modification will be described. The first driver 23A of the embodiment described above includes the spring 26, whereas a first driver 23A of this modification does not include the spring 26. The first driver 23A of this modification uses the pressure of a fluid, such as air, instead of the restoring force of the spring 26 to move the first clampers 22A from the release position to the clamping position. The differences will be mainly described below.

The first driver 23A of this modification includes a slider 25 and a cylinder 27. The slider 25 divides an internal space of the cylinder 27 into a first chamber R1 and a second chamber R2. Both the first chamber R1 and the second chamber R2 are hermetically sealed. The internal pressure of the first chamber R1 is adjusted by a first pressure adjustment mechanism 28. The internal pressure of the second chamber R2 is adjusted by a second pressure adjustment mechanism 34. The second pressure adjustment mechanism 34 and the second chamber R2 are connected to each other by a second connection line L2. The second connection line L2 is formed in the turntable 21 and the rotation shaft 41 independently of the first connection line L1, and is connected to the second pressure adjustment mechanism 34 via a rotary joint (not illustrated).

The second pressure adjustment mechanism 34 includes a pressure-increasing line 34*a* configured to increase the internal pressure of the second chamber R2. The pressure-increasing line 34*a* is provided with an opening/closing valve V3, a flow rate controller F3, a pressure controller P3, and the like. The opening/closing valve V3 opens/closes a flow path of the pressure-increasing line 34*a*. The flow rate controller F3 controls a flow rate of a fluid, such as air, to be supplied to the second chamber R2 when the internal pressure of the second chamber R2 is increased. The pressure controller P3 controls the internal pressure of the second chamber R2 when the internal pressure of the second chamber R2 is increased.

In addition, the second pressure adjustment mechanism 34 includes a pressure-decreasing line 34*b* configured to decrease the internal pressure of the second chamber R2. The pressure-decreasing line 34*b* is provided with an opening/closing valve V4, a flow rate controller F4, a pressure controller P4, and the like. The opening/closing valve V4 opens/closes a flow path of the pressure-decreasing line 34*b*. The flow rate controller F4 controls a flow rate of a fluid, such as air, to be discharged from the second chamber R2 when the internal pressure of the second chamber R2 is decreased. The pressure controller P4 controls the internal pressure of the second chamber R2 when the internal pressure of the second chamber R2 is decreased.

When the second pressure adjustment mechanism 34 increases the internal pressure of the second chamber R2 and the first pressure adjustment mechanism 28 decreases the internal pressure of the first chamber R1, the slider 25 is moved radially outward of the substrate W. As a result, the first clampers 22A are moved from the releasing position to the clamping position and come into contact with the substrate W. Impact generated at that time is determined by the pressure and flow rate of the fluid, and the like. The controller 90 controls the driving force or the driving speed by controlling the pressure controller P3 or P4 or the flow rate controller F3 or F4, which makes it possible to suppress the impact.

On the other hand, when the second pressure adjustment mechanism 34 decreases the internal pressure of the second chamber R2 and the first pressure adjustment mechanism 28 increases the internal pressure of the first chamber R1, the slider 25 is moved radially inward of the substrate W. As a result, the first clampers 22A are moved from the clamping position to the releasing position and are separated from the substrate W. The load applied to the substrate W due to the release of stress at that time is determined by the pressure and flow rate of the fluid, and the like. The controller 90 controls the driving force or the driving speed by controlling the pressure controller P3 or P4 or the flow rate controller F3 or F4, which makes it possible to suppress the load borne by the substrate W.

Figure 10A:
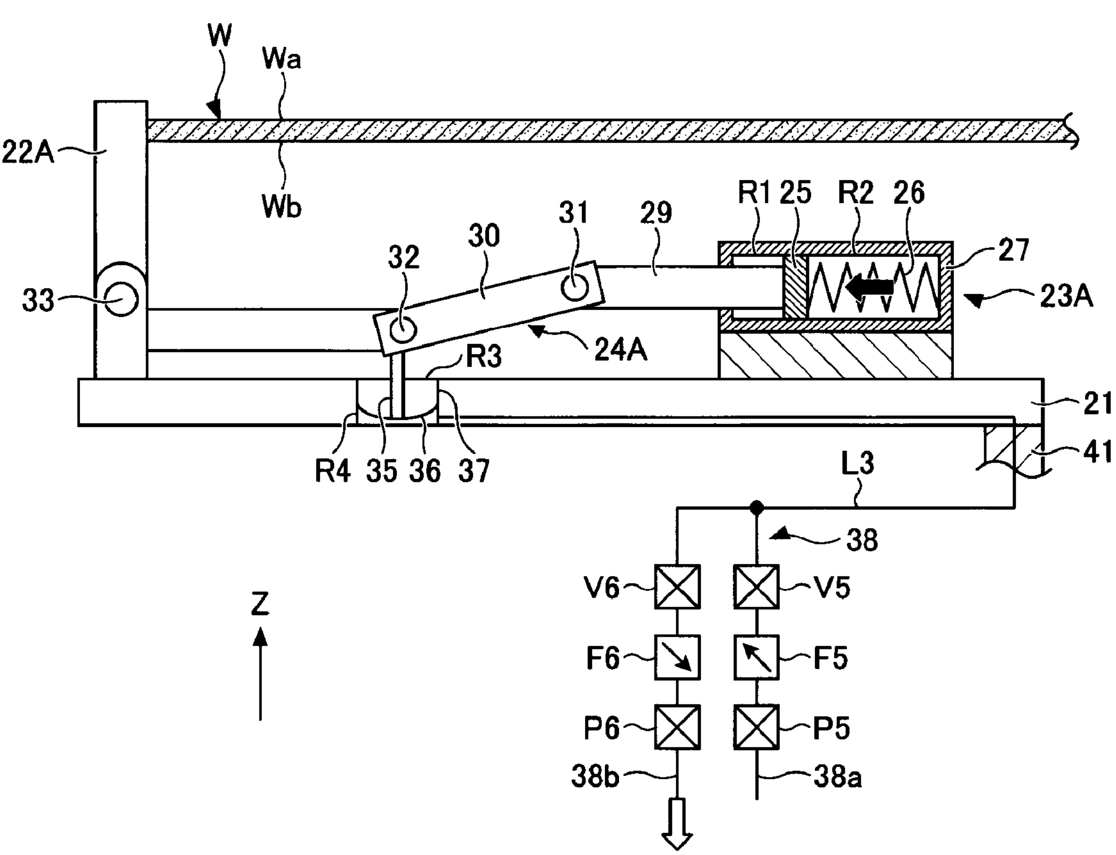
Figure 10B:
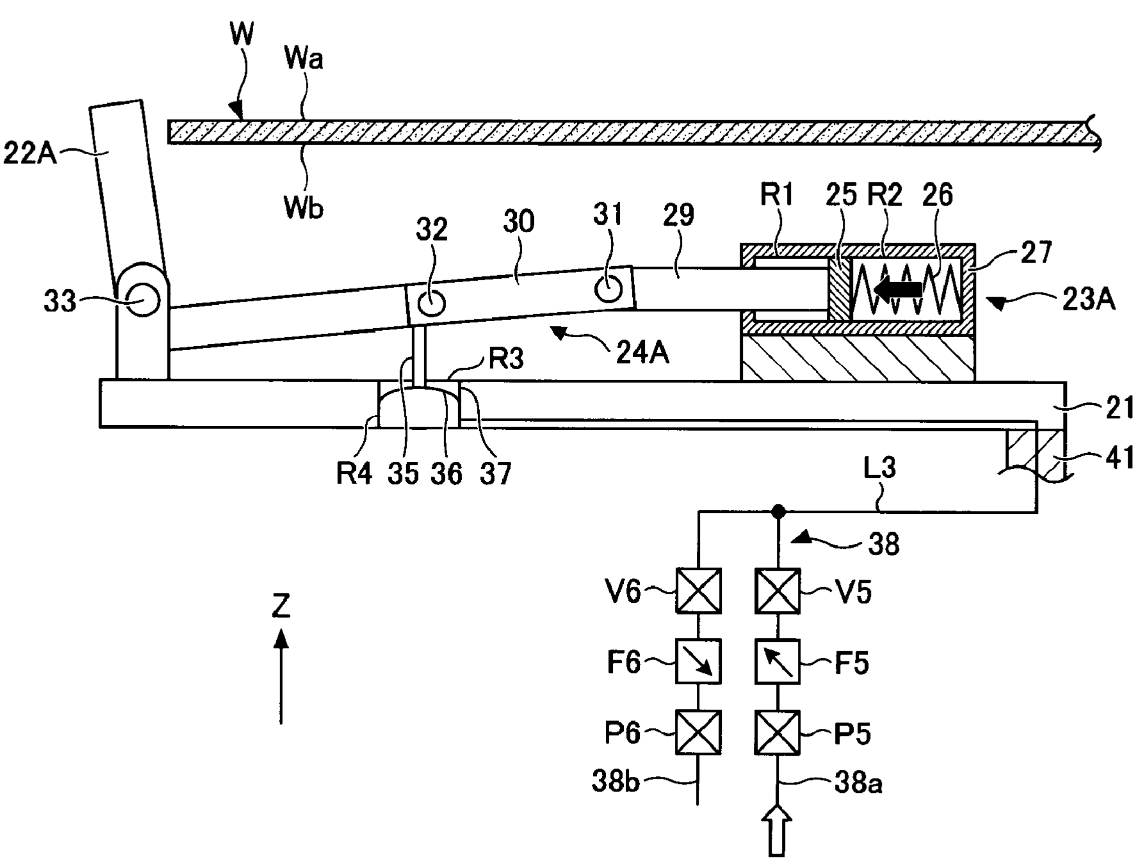

Next, with reference to FIGS. 10A and 10B, a holder 20 according to a second modification will be described. Differences will be mainly described below. A first driver 23A of this modification includes a lifting rod 35 on which a connecting portion between the first clamper 22A and the link 30 is placed, an elastic membrane 36 configured to support the lower end of the lifting rod 35, and a cylinder 37 including an upper chamber R3 and a lower chamber R4 divided by the elastic membrane 36. The cylinder 37 is fixed to the turntable 21. The lifting rod 35 penetrates the upper chamber R3 of the cylinder 37 and protrudes upwards from the cylinder 37.

The upper chamber R3 of the cylinder 37 is open without being hermetically sealed. An internal pressure of the upper chamber R3 is equal to the ambient air pressure and is maintained constant. On the other hand, the lower chamber R4 of the cylinder 37 is hermetically sealed. The internal pressure of the lower chamber R4 is adjusted by a third pressure adjustment mechanism 38. The third pressure adjustment mechanism 38 and the lower chamber R4 are connected to each other by a third connection line L3. The third connection line L3 is formed in the turntable 21 and the rotation shaft 41, and is connected to the third pressure adjustment mechanism 38 via a rotary joint (not illustrated).

The third pressure adjustment mechanism 38 includes a pressure-increasing line 38*a* configured to increase the internal pressure of the lower chamber R4. The pressure-increasing line 38*a* is provided with an opening/closing valve V5, a flow rate controller F5, a pressure controller P5, and the like. The opening/closing valve V5 opens/closes a flow path of the pressure-increasing line 38*a*. The flow rate controller F5 controls a flow rate of a fluid, such as air, to be supplied to the lower chamber R4 when the internal pressure of the lower chamber R4 is increased. The pressure controller P5 controls the internal pressure of the lower chamber R4 when the internal pressure of the lower chamber R4 is increased.

In addition, the third pressure adjustment mechanism 38 includes a pressure-decreasing line 38*b* configured to decrease the internal pressure of the lower chamber R4. The pressure-decreasing line 38*b* is provided with an opening/closing valve V6, a flow rate controller F6, a pressure controller P6, and the like. The opening/closing valve V6 opens/closes a flow path of the pressure-decreasing line 38*b*. The flow rate controller F6 controls a flow rate of a fluid, such as air, to be discharged from the lower chamber R4 when the internal pressure of the lower chamber R4 is decreased. The pressure controller P6 controls the internal pressure of the lower chamber R4 when the internal pressure of the lower chamber R4 is decreased.

When the third pressure adjustment mechanism 38 supplies a fluid, such as air, to the lower chamber R4 and increases the internal pressure of the lower chamber R4, the elastic membrane 36 is deformed into an upwardly convex curved surface, the third pin 33 is raised, and the slider 25 is moved radially inward of the substrate W against the restoring force of the spring 26. As a result, the first clamper 22A is moved from the clamping position to the releasing position and is separated from the substrate W. The load applied to the substrate W due to the release of stress at that time is determined by the supply pressure and supply speed of the fluid, and the like. The controller 90 controls the driving force or the driving speed by controlling the pressure controller P5 or the flow rate controller F5, which makes it possible to suppress the load borne by the substrate W.

On the other hand, when the third pressure adjustment mechanism 38 discharges a fluid, such as air, from the lower chamber R4 and decreases the internal pressure of the lower chamber R4, the elastic membrane 36 is deformed into a downwardly convex curved surface, and accordingly, the third pin 33 is lowered. In addition, the slider 25 is pushed back radially outward of the substrate W by the restoring force of the spring 26. As a result, the first clamper 22A is moved from the releasing position to the clamping position and comes into contact with the substrate W. Impact generated at that time is determined by the restoring force of the spring, the discharge pressure and discharge speed of the fluid, and the like. The controller 90 controls the driving force or the driving speed by controlling the pressure controller P6 or the flow rate controller F6, which makes it possible to suppress the impact.

Although the embodiments of the substrate processing apparatus and the substrate processing method according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

For example, the chemical liquid is an etching liquid in the above embodiment, but may be a resist liquid.

According to an aspect of the present disclosure, it is possible to suppress uneven processing of a substrate, and to suppress wear of the substrate and a clamper which clamps the substrate. Thus, it is possible to suppress generation of particles due to the wear.

What is claimed is:

1. A method of processing a substrate, the method comprising:

supplying a liquid to the substrate while rotating a holder configured to horizontally hold the substrate, wherein the holder includes a turntable, at least one first clamper configured to be rotated together with the turntable and moved between a clamping position at which the at least one first clamper clamps a peripheral edge of the substrate and a releasing position at which the at least one first clamper releases clamping the substrate, and at least one second clamper configured to be rotated with the turntable and moved between the clamping position and the releasing position independently of the at least one first clamper, and wherein the method further comprises alternately clamping the peripheral edge of the substrate using the at least one first clamper and the at least one second clamper while the liquid is being supplied to the substrate, wherein the at least one first clamper is moved between the releasing position and the clamping position by swinging around a horizontal pin held by the turntable, and wherein the at least one first clamper is temporarily stopped at both an intermediate position between the releasing position and the clamping position and the releasing position in a state in which the substrate is clamped by the at least one second clamper while the liquid is being supplied to the substrate.

2. The method of claim 1, wherein the at least one first clamper and the at least one second clamper include three or more first clampers and three or more second clampers, respectively, which are alternately arranged along the peripheral edge of the substrate, and wherein the method further comprises causing the three or more first clampers to move from the releasing position to the clamping position in a predetermined order in a state in which the three or more second clampers hold the substrate.

* * * * *